(12) United States Patent
Djenguerian et al.

(10) Patent No.: US 7,385,312 B2
(45) Date of Patent: Jun. 10, 2008

(54) METHOD AND APPARATUS FOR MODE SELECTION FOR HIGH VOLTAGE INTEGRATED CIRCUITS

(75) Inventors: Alex B. Djenguerian, Saratoga, CA (US); William B. Smith, San Jose, CA (US); Kent Wong, Fremont, CA (US); Zhao-Jun Wang, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 11/527,803

(22) Filed: Sep. 26, 2006

(65) Prior Publication Data
US 2007/0018508 A1    Jan. 25, 2007

Related U.S. Application Data

(63) Continuation of application No. 10/679,108, filed on Oct. 3, 2003.

(51) Int. Cl.
*H02B 1/24* (2006.01)
*H03K 19/00* (2006.01)

(52) U.S. Cl. .................................. 307/130; 326/16
(58) Field of Classification Search .................. 361/90; 307/130; 326/16
See application file for complete search history.

(56) References Cited

U.S. PATENT DOCUMENTS

| | | | |
|---|---|---|---|
| 5,023,476 A * | 6/1991 | Watanabe et al. | 327/540 |
| 5,072,138 A * | 12/1991 | Slemmer et al. | 326/16 |
| 5,313,381 A | 5/1994 | Balakrishnan | |
| 6,081,466 A * | 6/2000 | McClure et al. | 365/201 |
| 6,388,853 B1 | 5/2002 | Balakrishnan et al. | |
| 6,407,581 B1 * | 6/2002 | Hull et al. | 326/83 |
| 6,603,219 B2 * | 8/2003 | Toyama et al. | 307/38 |
| 6,603,331 B1 | 8/2003 | Om'Mani et al. | |
| 6,657,451 B2 | 12/2003 | Meli | |
| 7,183,792 B2 * | 2/2007 | Marr | 326/16 |
| 2002/0105372 A1 | 8/2002 | Balakrishnan et al. | |
| 2004/0183559 A1 | 9/2004 | Ware et al. | |

FOREIGN PATENT DOCUMENTS

EP    0 585 789 A1    3/1994

OTHER PUBLICATIONS

European Search Report, Feb. 22, 2005, Power Integrations, Inc.

(Continued)

*Primary Examiner*—Michael Sherry
*Assistant Examiner*—Michael Rutland-Wallis
(74) *Attorney, Agent, or Firm*—Blakely Sokoloff Taylor & Zafman LLP

(57) ABSTRACT

A method is disclosed to add functionality to a terminal of a high voltage integrated circuit without the penalty of additional high voltage circuitry. The benefit is that alternative modes of operation can be selected for testing, trimming parameters of the integrated circuit, or any other purpose without the cost of an additional terminal. In one embodiment, ordinary low voltage circuitry monitors the voltage on the terminal that normally is exposed to high voltage. The configuration of a simple voltage detector and an ordinary latch allows easy entry into the test and trimming mode when the integrated circuit is not in the intended application, but prohibits entry into the test and trimming mode when the integrated circuit operates in the intended application.

12 Claims, 2 Drawing Sheets

OTHER PUBLICATIONS

"TOP242-250 TOPSwitch®-GX Family Extended Power, Design Flexible, EcoSmart®, Integrated Off-line Switcher," *Power Integrations, Inc.*, (Aug. 2003), pp. 1-52.

"TNY264/266-268 TinySwitch®-II Family Enhanced, Energy Efficient, Low Power Off-line Switcher," *Power Integrations, Inc.*, (Apr. 2003), pp. 1-24.

* cited by examiner

METHOD AND APPARATUS FOR MODE SELECTION FOR HIGH VOLTAGE INTEGRATED CIRCUITS

REFERENCE TO PRIOR APPLICATION

This application is a continuation of U.S. application Ser. No. 10/679,108, filed Oct. 3, 2003, now pending, entitled "Method and Apparatus for Mode Selection for High Voltage Integrated Circuits."

BACKGROUND OF THE INVENTION

1. Field of the Invention

The present invention relates generally to integrated circuits, and more specifically, the present invention relates to integrated circuits that switch high voltages in power converters.

2. Background Information

It is a common practice in the design of integrated circuits to include functions and modes of operation that are not used when the integrated circuit is in its intended application. These alternative modes of operation may be used instead for a variety of purposes in the production of the integrated circuits and in the maintenance of equipment that uses them. For example, it may be desirable to operate the integrated circuit at special frequencies, voltages or currents that reduce the time to test the device or that increase the accuracy and reliability of testing. The manufacturing process of some integrated circuits includes an adjustment or trimming of internal parameters after the integrated circuit is assembled as part of the final test. Final adjustment may be accomplished by selecting a special trimming mode of the integrated circuit. While in the trimming mode, parameters may be adjusted by appropriate manipulation of signals at the terminals of the integrated circuit. The trimming mode may then be disabled after the adjustments are completed.

An alternative mode of operation could also be an alternative normal mode of operation, as distinguished from a test mode or a trimming mode. A normal mode of operation is one in which the integrated circuit operates in its intended application. An alternative mode of operation that is also a normal mode of operation might relate to the frequency of a switching power supply. For example, one normal mode of operation could use a fixed frequency whereas another normal mode of operation could use a variable frequency. Some integrated circuits are field programmable, such that the user in each specific application may select the particular mode of operation.

The technology of most integrated circuits limits the voltage on the terminals to the maximum power supply voltage for the device, which is typically about 40 volts, but can vary depending on the manufacturing process and the feature size of the devices that comprise the integrated circuit. The voltage is measured with respect to a ground reference terminal that is usually a power supply terminal. The ground reference terminal is typically at the most negative electrical potential of the integrated circuit. In the subsequent discussion, such voltages that are usually less than about 40 volts are referred to as using ordinary low voltages. Terminals that can withstand a maximum voltage less than about 40 volts are referred to as low voltage terminals. Terminals that can withstand a maximum voltage substantially greater than about 40 volts are referred to as high voltage terminals.

Some terminals of the integrated circuit may be limited to a substantially lower voltage than the maximum power supply voltage. In the integrated circuits that are limited to ordinary low voltages, virtually any terminal of the device can be used to select alternative modes of operation without difficulty because only low voltage circuits are required to monitor the state of any terminal and to respond to any voltages that may be applied to the terminal.

Not all integrated circuits operate from low voltages. In the category of high voltage integrated circuits at least one terminal is exposed to high voltage in the intended application. These devices typically integrate ordinary low voltage circuitry with a high voltage power semiconductor. The high voltage terminal operates at voltages typically greater than 100 volts, which is substantially greater than the other terminals will tolerate without damage. A common application for high voltage integrated circuits is in switching power supplies. For applications in off-line alternating current (AC)-direct current (DC) power supplies, the voltage at the high voltage terminal can be in the neighborhood of 700 volts.

It will be recognized by one skilled in the art that the distinction between high voltage terminals and low voltage terminals is fundamentally one of relative voltage and not absolute voltage. For example, an integrated circuit technology may use materials or geometries such that ordinary low voltages are less than 1 volt, and any voltage greater than 10 volts is considered to be high voltage.

An objective in the design of integrated circuits is to realize the desired functions at the lowest cost. Two factors that influence the cost of the integrated circuit are the amount of semiconductor material and the number of terminals. Since high voltage devices are larger and therefore use more semiconductor material than low voltage devices, it is advantageous to minimize the number of circuits that are exposed to high voltage in the integrated circuit. It is also advantageous to use each terminal of the integrated circuit for as many functions as possible to minimize the number of terminals.

SUMMARY OF THE INVENTION

Disclosed is a method to select alternative functional modes of operation of an integrated circuit through a terminal that can withstand a high maximum voltage. In one embodiment, an integrated circuit includes a functional circuit coupled to a plurality of terminals including first, second and third terminals of the integrated circuit. The first terminal is adapted to withstand a first maximum voltage relative to the second terminal while the third terminal is adapted to withstand a second maximum voltage relative to the second terminal. The second maximum voltage is substantially greater than the first maximum voltage. The integrated circuit also includes a detector circuit coupled to detect a voltage at the third terminal. The detector circuit has a first state when the voltage at the third terminal is less than a first threshold and the detector has a second state when the voltage on the third terminal is greater than a second threshold. The integrated circuit also includes a selector circuit coupled to the detector circuit and the functional circuit. The selector circuit is adapted to select one of at least two distinct modes of operation for the functional circuit in response to the plurality of terminals. Additional features and benefits of the present invention will become apparent from the detailed description, figures and claims set forth below.

BRIEF DESCRIPTION OF THE DRAWINGS

The present invention detailed illustrated by way of example and not limitation in the accompanying Figures.

DETAILED DESCRIPTION

Figure 1:
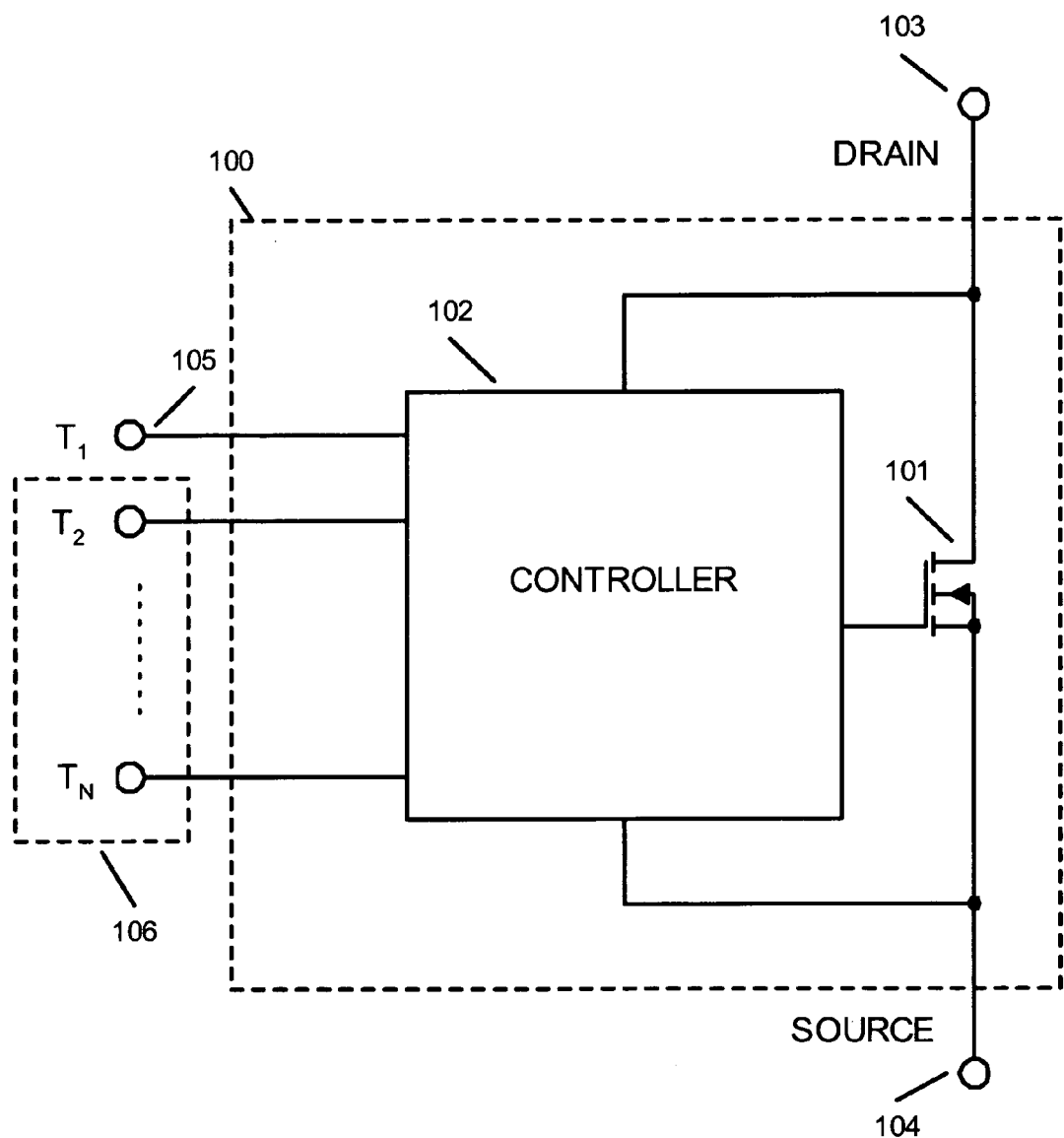
FIG. 1 is a block diagram of a high voltage integrated circuit of the type that typically would be used in a switching power supply. It shows a high voltage power transistor and a controller.

An embodiment of a method for selecting alternative modes of operation in a high voltage integrated circuit is disclosed. In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

In the context of this disclosure, terminals of integrated circuits may be either external or internal. External terminals couple to circuitry outside the physical package of the integrated circuit, whereas internal terminals do not couple to circuits outside the package of the integrated circuit. Terminals should be assumed to be external unless otherwise stated.

A method for using a high voltage terminal of an integrated circuit to select alternative functional modes of operation of the integrated circuit in accordance with the teachings of the present invention will now be described. Embodiments of the present invention involve methods and apparatuses to select different configurations and functional modes of operation of the internal circuits through manipulation of voltages at the terminals.

In one embodiment, the integrated circuit derives its internal power supply from either the high voltage terminal or from a low voltage terminal, depending on the voltage present at each terminal. A voltage buffer circuit limits the voltage from the high voltage terminal. Ordinary low voltage circuits detect the presence of high voltage on the high voltage terminal. An alternative mode of operation is selected when voltage is applied to the terminals with a particular sequence and magnitude that cannot occur in the intended use of the integrated circuit. Application of high voltage to the high voltage terminal latches the integrated circuit into its desired mode of operation.

In one embodiment of the present invention, a method is disclosed to select a functional mode of operation of an integrated circuit by a voltage on a terminal that has the ability to withstand a high maximum voltage in normal operation. The method uses ordinary low voltage circuits to monitor the voltage on the high voltage terminal to add a useful function to the high voltage terminal without the burden and expense of additional high voltage circuits.

In particular, a terminal that switches high voltage in normal operation is allowed to be a terminal that selects alternative modes of operation. The benefit in the use of a high voltage terminal for this purpose is greatest for integrated circuits that have only a few terminals. Whereas it is relatively straightforward to encode multiple functions into integrated circuits that have many low voltage terminals, the task becomes difficult when only a few terminals are available.

To illustrate, power integrated circuits with only three terminals are common in switching power supplies. In one embodiment, one of the three terminals serves as the ground reference for the other two. Thus, integrated circuits with three terminals have only two terminals available to perform all the required functions. One of the terminals is exposed to high voltage in normal operation. Therefore, the high voltage terminal must withstand a high maximum voltage. The method described here allows the use of the high voltage terminal to extend the functionality of the integrated circuit without the cost of an additional terminal or the use of high voltage internal circuits.

In one embodiment, the integrated circuit contains a high voltage transistor and a low voltage controller configured in a manner that is suitable for use in a switching power supply. FIG. 1 shows a typical arrangement. In one embodiment, the integrated circuit is a switched mode power supply controller that may be used to regulate the transfer of energy from an input of a switching power supply to an output of the switching power supply through an energy transfer element. Inside the envelope of integrated circuit 100 are a high voltage power transistor 101 and a controller 102. In one embodiment, the transistor is a field effect device with its drain coupled to the high voltage terminal 103 and its source coupled to a ground reference terminal 104. Controller 102 is coupled to terminals 103 and 104 by internal connections.

In one embodiment, the controller 102 is also coupled to a terminal 105 that receives signals from external circuits and internal circuits to maintain desired operation of the integrated circuit. In one embodiment the terminal 105 is a control terminal, a power supply terminal as well as a functional terminal. For purposes of this disclosure, a control terminal is one that regulates a switching power supply. A power supply terminal is one that is coupled to the voltage and current necessary to operate the internal circuits. A functional terminal is one that performs any other desired operation on the integrated circuit. Any number of additional terminals 106 may be present as required for desired functions.

Figure 2:
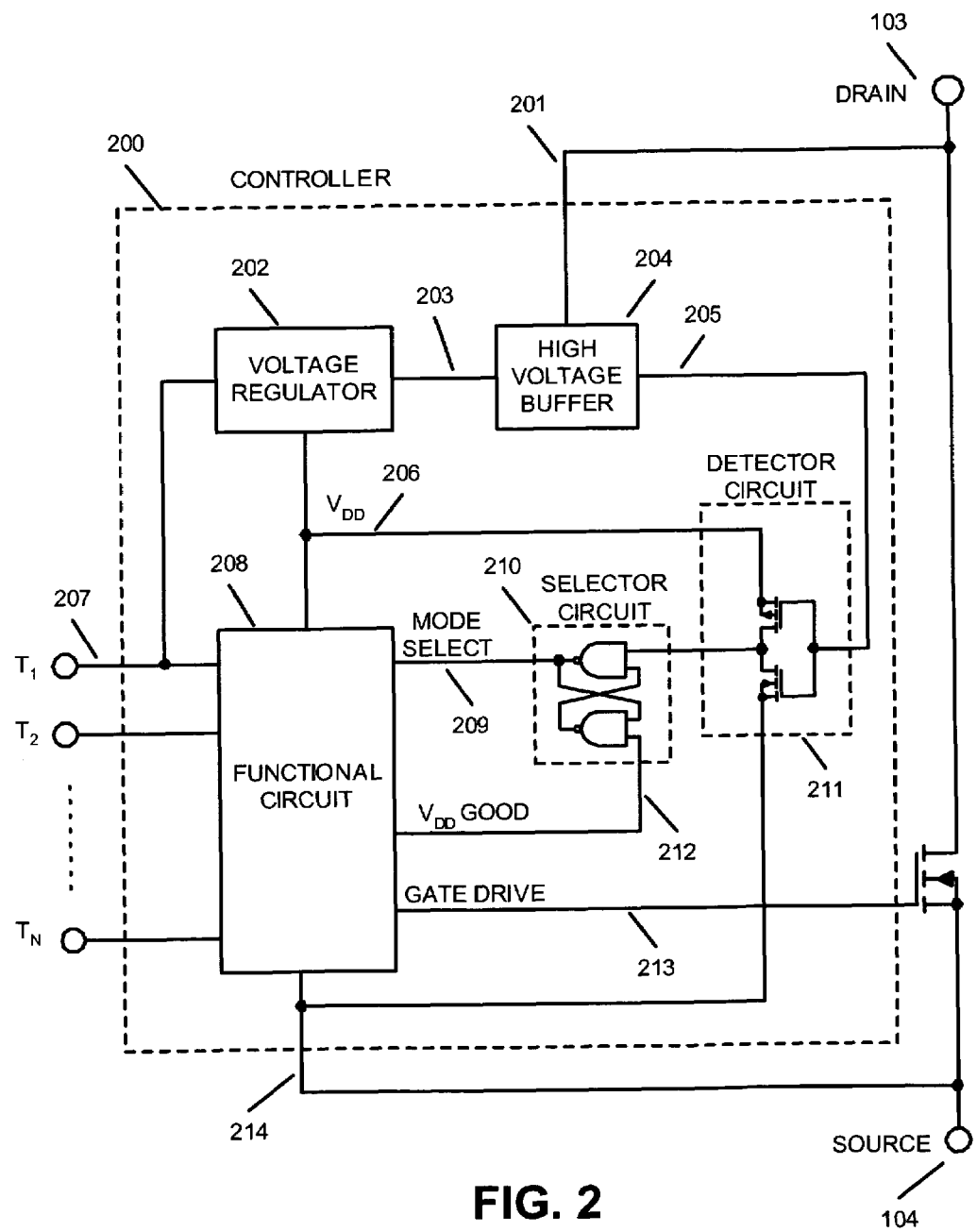
FIG. 2 is a functional block diagram of the high voltage integrated circuit of FIG. 1, showing internal elements of the controller that represents a preferred embodiment of this invention.

In one embodiment, the integrated circuit 100 of FIG. 1 includes the elements illustrated in FIG. 2. As shown in the embodiment depicted in FIG. 2, controller 200 is coupled to the high voltage terminal 103 by internal connection 201, and to the ground reference terminal 104 by internal connection 214. In one embodiment, controller 200 is included in a switching power supply controller that may be used to regulate the transfer of energy from an input of a switching power supply to an output of the switching power supply through an energy transfer element. In the following description, all voltages should be assumed to be relative to the ground reference terminal 104 or internal connection 214 unless otherwise stated.

In one embodiment, a high voltage buffer circuit 204 is adapted to provide internal voltages 203 and 205, which are not allowed to exceed limits that are safe for the low voltage devices in the controller 200. The internal voltages are typically is less than 40 volts, as in ordinary low voltage integrated circuits. In one embodiment, the internal voltage 203 is limited to 36 volts, and the internal voltage 205 is limited to 15 volts. One skilled in the art will be familiar with the design of high voltage buffer circuits. A Zener diode, a junction field effect transistor (JFET) resistor, and a voltage-controlled current source are some examples of known circuits that could be suitable for high voltage buffer circuits in particular applications in accordance with the teachings of the present invention.

In one embodiment, an internal voltage regulator circuit 202 receives the internal voltage 203 and delivers a regulated voltage 206 that is less than the buffered higher internal voltage 203. One skilled in the art will be familiar with the design of suitable voltage regulator circuits. The regulated voltage 206 is typically about 5 volts. In one embodiment the regulated voltage is 5.8 volts.

As shown in the depicted embodiment, the voltage regulator circuit 202 is also coupled to terminal 207 that in one embodiment is a control terminal, a power supply terminal and a functional terminal. In one embodiment, terminal 207 is not coupled to any circuitry external to the integrated circuit. In such an embodiment, the integrated circuit would have only two external terminals, which are terminals 103 and 104 in the embodiments illustrated in FIGS. 1 and 2. In one embodiment, voltage regulator 202 can provide regulated voltage 206 from either the internal voltage 203 or from a voltage at terminal 207 so long as either internal voltage 203 or the voltage at terminal 207 is sufficiently greater than the regulated voltage 206.

A functional circuit 208 performs all other functions that are not explicit in the FIG. 2. In one embodiment, the gate of the power transistor is driven by a signal 213 from functional circuit 208. A driver circuit to generate signal 213 is included in functional circuit 208.

In one embodiment, functional circuit 208 monitors the regulated voltage 206. When the regulated voltage 206 is high enough for proper operation, an internal signal 212, which is labeled "$V_{DD}$ GOOD" in FIG. 2, provided by functional circuit 208 goes to the logic high state. The internal signal 212 is at the logic low state when the regulated voltage 206 is too low for the circuits to operate properly. A voltage monitor circuit to monitor the regulated voltage 206 is included in functional circuit 208.

In one embodiment, a mode management circuit that is included in functional circuit 208 receives a mode select signal 209 that selects an alternative mode of operation for controller 200. For example, when the mode select signal 209 is at logic low and controller 200 is therefore in the alternative mode of operation, a signal at terminal 207 or any of the other functional terminals can change the behavior or the configuration of the functional circuit 208. The changes can be either temporary or permanent. In one embodiment, logic low on mode select signal 209 causes the integrated circuit to enter the alternative mode of operation that allows testing and trimming. A logic high on mode select signal 209 causes the controller 200 to enter the normal mode of operation and leave the alternative mode of operation that allows testing and trimming. It is appreciated that although the alternative mode of operation is being described herein for example purposes as a mode of operation for testing and trimming, other modes of operation may be accomplished with the alternative mode of operation, including other normal modes of operation in accordance with the teachings of the present invention.

In one embodiment, the alternative mode of operation that allows testing and trimming is prohibited when the integrated circuit is used in its intended application during the normal mode of operation. In one embodiment, in the intended application, voltage is applied to the drain terminal 103 at internal connection 201 before there is voltage on any other terminal. The presence of voltage on the drain terminal 103 activates the high voltage buffer 204 so that voltage appears at its output of internal voltage 205 that is coupled to a detector circuit 211. In one embodiment, the detector circuit 211 includes an ordinary complementary metal oxide semiconductor (CMOS) inverter, as shown in FIG. 2, which will be familiar to one skilled in the art.

As illustrated in the embodiment depicted in FIG. 2, a selector circuit 210 generates the mode select signal 209 in response to the input received from the output of detector circuit 211 as well as the internal signal 212 received from functional circuit 208. In yet another embodiment, it is appreciated that selector circuit 210 may be responsive to other influences such as for example signals present on other internal or external terminals including for example terminal 207 or the like. Thus, since the output of detector circuit 211 and the internal signal 212 provided by functional circuit 208 are responsive to conditions at for example terminals 103 and 104, and since selector circuit 210 may also be responsive to other terminals such as for example terminal 207, selector circuit 210 correspondingly generates mode select signal 209 in response to for example terminals 103, 104 and/or 207 in accordance with the teachings of the present invention.

In one embodiment, when the internal voltage 205 at the input to the detector circuit 211 is greater than a threshold of for example 2.9 volts, the detector circuit 211 causes a selector circuit 210 to bring the mode select signal 209 from a logic low to a logic high. The mode select signal 209 output from the selector circuit 210 is allowed to return to its original state when the signal 212 goes to logic low. The signal 212 goes to logic low when the regulated voltage 206 is too low for all the circuits to operate properly.

In one embodiment, the configuration of the selector circuit 210 includes ordinary latch circuitry, as shown in FIG. 2, which will be familiar to one skilled in the art, which assures that the integrated circuit in its intended application can never inadvertently enter the alternative mode that allows testing and trimming when controller 200 is operating in normal mode in its intended application. For instance, the latch of selector circuit 210 holds the mode select signal 209 at logic high even when the internal voltage 205 from the high voltage buffer does not stay above the threshold of for example 2.9 volts, as would occur in the normal operation of a switching power supply.

In one embodiment, the alternative mode for testing and trimming is enabled only through a simple sequence that does not occur during the normal mode of operation in the intended application. For example, in one embodiment, to enter the test and trimming mode, all terminals 103, 104 and 207, are initially set to zero volts. Terminal 207 is raised to approximately 5.8 volts while the voltage at the drain terminal 103 at internal connection 201 remains low enough to keep the internal voltage 205 at the input to the detector circuit 211 below the threshold of approximately 2.9 volts. As the regulated voltage 206 rises, the selector circuit 210 holds the mode select signal 209 at logic low to allow the alternative mode for test and trimming. Application of enough voltage on the drain terminal 103 at internal connection 201 to raise the internal voltage 205 above the threshold of for example approximately 2.9 volts will latch the mode select signal 209 at logic high to leave the test and trimming mode.

In one embodiment, the threshold of the detector circuit 211 may be variable or adjustable in response to the signals at a plurality of low voltage terminals. In another embodiment, the threshold of the detector circuit 211 has hysteresis, such that the threshold changes between a first threshold and a second threshold, depending on the voltage at the input to the detector circuit 211. It is appreciated that the design of circuits with thresholds that have hysteresis will be familiar to one skilled in the art.

In the foregoing detailed description, the method and apparatus of the present invention have been described with reference to a specific exemplary embodiment thereof. It will, however, be evident that various modifications and changes may be made thereto without departing from the broader spirit and scope of the present invention. The present specification and figures are accordingly to be regarded as illustrative rather than restrictive

What is claimed is:

1. A method of setting a mode of operation of a power supply control integrated circuit, comprising:
   buffering a first voltage at a high voltage terminal of the power supply control integrated circuit to provide an internal voltage to low voltage circuitry of the power supply control integrated circuit, wherein the internal voltage is responsive to the first voltage, wherein the low voltage circuitry is adapted to withstand a first maximum voltage relative to a reference terminal of the power supply control integrated circuit, wherein the high voltage terminal is adapted to withstand a second maximum voltage relative to the reference terminal, wherein the second maximum voltage is substantially greater than the first maximum voltage;
   setting a normal mode of operation of the power supply control integrated circuit with the low voltage circuitry if the internal voltage is above a first threshold voltage;
   setting an alternative mode of operation of the power supply control integrated circuit with the low voltage circuitry in response to detecting that the internal voltage is below a second threshold voltage; and
   switching a power switch during the normal mode of operation of the power supply control integrated circuit, wherein the power switch is coupled between the high voltage terminal and the reference terminal of the power supply control integrated circuit.

2. The method of setting the mode of operation of the power supply control integrated circuit of claim 1 further comprising resetting the power supply control integrated circuit from the alternative mode of operation into the normal mode of operation of the power supply control integrated circuit in response to an application of a high voltage to the high voltage terminal.

3. The method of claim 1 wherein setting the alternative mode of operation comprises setting the power supply control integrated circuit to a testing mode of operation that is different from the normal mode of operation.

4. The method of claim 1 wherein setting the alternative mode of operation comprises setting the power supply control integrated circuit to a trimming mode that is different from the normal mode of operation.

5. The method of setting the mode of operation of the power supply control integrated circuit of claim 1 including detecting a voltage at the high voltage terminal with a detector circuit and selecting a mode of operation for a functional circuit with a selector circuit.

6. The method of claim 5 wherein the setting the mode of operation of the power supply control integrated circuit includes determining a normal or alternative mode of operation according to a threshold in the detector circuit.

7. The method of claim 6 further comprising adjusting the threshold in the detector circuit in response to signals at a plurality of low voltage terminals in the power supply control integrated circuit.

8. The method of claim 7 wherein adjusting the threshold in the detector circuit includes changing the threshold between a first threshold and a second threshold.

9. The method of claim 5 wherein selecting the mode of operation for a functional circuit includes using latch circuitry to assure that the power supply integrated circuit does not enter the alternative mode of operation during an intended use of the power supply control integrated circuit.

10. The method of claim 5 wherein the setting the alternative mode of operation of the power supply control integrated circuit includes generating a mode select signal in response to an input received from the detector circuit and the functional circuit.

11. The method of claim 1, further comprising:
    regulating the internal voltage with a voltage regulator circuit to provide the low voltage circuitry with a regulated voltage; and
    regulated in a voltage received at third terminal of the power supply control integrated circuit with the voltage regulator circuit to provide the low voltage circuitry with the regulated voltage, wherein the third terminal is adapted to withstand the first maximum voltage relative to the reference terminal.

12. The method of claim 11, wherein the voltage regulator circuit regulates the internal voltage to provide the regulated voltage if the voltage received at the third terminal is less than the regulated voltage and wherein the voltage regulator circuit regulates the voltage received at the third terminal to provide the regulated voltage if the internal voltage is less than the regulated voltage.

* * * * *